(12) United States Patent
Su et al.

(10) Patent No.: US 9,905,674 B2
(45) Date of Patent: Feb. 27, 2018

(54) VERTICAL POWER MOSFET AND METHODS FOR FORMING THE SAME

(71) Applicant: Taiwan Semiconductor Manufacturing Company, Ltd., Hsin-Chu (TW)

(72) Inventors: Po-Chih Su, New Taipei (TW); Hsueh-Liang Chou, Jhubei (TW); Ruey-Hsin Liu, Hsin-Chu (TW); Chun-Wai Ng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 111 days.

(21) Appl. No.: 14/449,675

(22) Filed: Aug. 1, 2014

(65) Prior Publication Data

US 2014/0342520 A1    Nov. 20, 2014

Related U.S. Application Data

(62) Division of application No. 13/486,768, filed on Jun. 1, 2012, now Pat. No. 8,823,096.

(51) Int. Cl.
*H01L 29/66* (2006.01)
*H01L 27/088* (2006.01)
(Continued)

(52) U.S. Cl.
CPC .. *H01L 29/66666* (2013.01); *H01L 21/30604* (2013.01); *H01L 21/743* (2013.01); *H01L 21/76877* (2013.01); *H01L 21/823487* (2013.01); *H01L 27/088* (2013.01); *H01L 27/098* (2013.01); *H01L 29/0847* (2013.01); *H01L 29/402* (2013.01);
(Continued)

(58) Field of Classification Search
CPC ........... H01L 29/4175; H01L 29/41766; H01L 29/7835; H01L 29/66666; H01L 29/7827; H01L 29/402; H01L 29/7833
See application file for complete search history.

(56) References Cited

U.S. PATENT DOCUMENTS 5,568,422 A * 10/1996 Fujiwara ........... H01L 27/11521
257/315
6,600,182 B2   7/2003 Rumennik
(Continued)

FOREIGN PATENT DOCUMENTS

JP   2002094055   3/2002

*Primary Examiner* — Bilkis Jahan
*Assistant Examiner* — Victor Barzykin
(74) *Attorney, Agent, or Firm* — Slater Matsil, LLP

(57) ABSTRACT

A device includes a semiconductor region in a semiconductor chip, a gate dielectric layer over the semiconductor region, and a gate electrode over the gate dielectric. A drain region is disposed at a top surface of the semiconductor region and adjacent to the gate electrode. A gate spacer is on a sidewall of the gate electrode. A dielectric layer is disposed over the gate electrode and the gate spacer. A conductive field plate is over the dielectric layer, wherein the conductive field plate has a portion on a drain side of the gate electrode. A conductive via is disposed in the semiconductor region. A source electrode is underlying the semiconductor region, wherein the source electrode is electrically shorted to the conductive field plate through the conductive via.

19 Claims, 9 Drawing Sheets

(51) Int. Cl.
*H01L 27/098* (2006.01)
*H01L 21/74* (2006.01)
*H01L 29/78* (2006.01)
*H01L 21/306* (2006.01)
*H01L 21/768* (2006.01)
*H01L 29/08* (2006.01)
*H01L 29/40* (2006.01)
*H01L 21/8234* (2006.01)

(52) U.S. Cl.
CPC .. *H01L 29/7827* (2013.01); *H01L 21/823456* (2013.01); *H01L 21/823493* (2013.01); *H01L 29/7833* (2013.01)

(56) References Cited

U.S. PATENT DOCUMENTS

| | | | |
|---|---|---|---|
| 6,831,332 B2* | 12/2004 | D'Anna | H01L 29/7835 257/343 |
| 8,129,785 B2 | 3/2012 | Izumi et al. | |
| 8,304,825 B2 | 11/2012 | Garnett | |
| 2002/0033508 A1* | 3/2002 | Morikawa | H01L 29/402 257/368 |
| 2002/0100951 A1 | 8/2002 | Yasuhara et al. | |
| 2006/0038224 A1 | 2/2006 | Shibib et al. | |
| 2006/0231904 A1* | 10/2006 | Kocon | H01L 21/823487 257/391 |
| 2007/0034942 A1* | 2/2007 | Xu | H01L 29/1083 257/329 |
| 2010/0140702 A1* | 6/2010 | Park | H01L 29/7838 257/343 |
| 2010/0155836 A1* | 6/2010 | Hebert | H01L 21/823487 257/334 |
| 2010/0163988 A1 | 7/2010 | Chow et al. | |
| 2010/0237415 A1 | 9/2010 | Grebs et al. | |
| 2010/0327349 A1 | 12/2010 | Arie et al. | |
| 2011/0210956 A1* | 9/2011 | Girdhar | H01L 27/088 345/212 |
| 2011/0266620 A1* | 11/2011 | Terrill | H01L 21/743 257/343 |
| 2013/0075741 A1* | 3/2013 | Mallikarjunaswamy | H01L 21/761 257/66 |
| 2013/0134512 A1 | 5/2013 | Cheng et al. | |

* cited by examiner

VERTICAL POWER MOSFET AND METHODS FOR FORMING THE SAME

PRIORITY CLAIM AND CROSS-REFERENCE

This application is a divisional of U.S. patent application Ser. No. 13/486,768, entitled "Vertical Power MOSFET and Methods for Forming the Same," filed on Jun. 1, 2012, which application is incorporated herein by reference.

BACKGROUND

In a conventional vertical power Metal-Oxide-Semiconductor Field Effect Transistor (MOSFET), two p-body regions are formed in an n-type epitaxy region. The vertical power MOSFET are such named since its source electrode and drain region are overlapped. A portion of the epitaxy region between the two p-body regions is lightly doped to form an n-type doped region, which is sometimes known as an N-type Junction Field Effect Transistor (n-JFET) region. The p-body regions and the n-JFET region are under a gate dielectric and a gate electrode. When the gate is applied with a positive voltage, the accumulation regions of electrons are formed in the p-body regions. The accumulation regions act as the channel regions that connect the source region of the vertical power MOSFET to the n-JFET region, which is further connected to the drain region of the power MOSFET through the n-type epitaxy region. Accordingly, a source-to-drain current is conducted from the source region to the channels in the p-body regions, the n-JFET region, the epitaxy region, and then to the drain region.

The n-JFET region is underlying the gate electrode, with the gate dielectric layer disposed between the n-JFET region and the gate electrode. There is a large overlap area between the gate electrode and the n-JFET region. As a result, there is a significant gate-to-drain capacitance, which adversely affects the performance, including the speed, of the vertical MOSFET. Furthermore, the n-JFET region is lightly doped since is it a part of the n-type epitaxy region. The resistance of the n-JFET region is thus high, which adversely affects the drive current of the vertical power MOSFET.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A vertical power Metal-Oxide-Semiconductor Field Effect Transistor (MOSFET) and the method of forming the same are provided in accordance with various exemplary embodiments. The intermediate stages of forming the vertical power MOSFET are illustrated. The variations of the embodiments are discussed. Throughout the various views and illustrative embodiments, like reference numbers are used to designate like elements.

Figure 1:
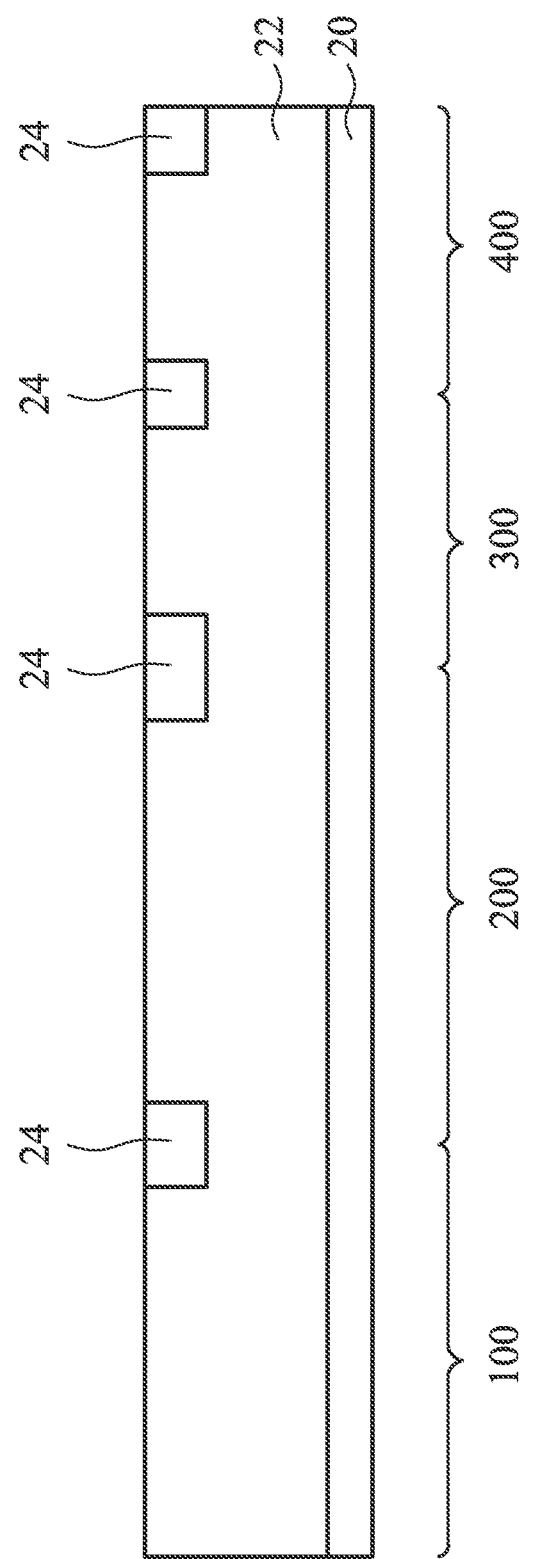
FIGS. 1 through 9 are cross-sectional views of intermediate stages in the manufacturing of a vertical power Metal-Oxide-Semiconductor Field Effect Transistor (MOSFET) in accordance with some exemplary embodiments.

FIGS. 1 through 9 are cross-sectional views of intermediate stages in the formation of an n-type vertical power MOSFET. Referring to FIG. 1, semiconductor layer 20, which may be a semiconductor substrate, is provided. Semiconductor layer 20 may have a crystalline silicon structure. Alternatively, semiconductor layer 20 is formed of other semiconductor materials such as silicon germanium. In some embodiments, semiconductor layer 20 is a heavily doped layer (P+ layer) doped with a p-type impurity such as phosphorous or arsenic, for example, to an impurity concentration between about $10^{19}/cm^3$ and about $10^{21}/cm^3$. In the described embodiments, the term "heavily doped" means an impurity concentration above about $10^{19}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments.

Over heavily doped semiconductor layer 20, epitaxy layer 22 is formed through epitaxy, and is lightly doped with a p-type impurity. The impurity concentration of epitaxy layer 22 may be between about $10^{14}/cm^3$ and about $10^{16}/cm^3$. It is appreciated, however, that the values recited throughout the description are merely examples, and may be changed to different values. Epitaxy layer 22 is hence a P− layer, and is referred to as P− epitaxy layer 22 hereinafter. P− epitaxy layer 22 may be a silicon layer, although other semiconductor materials such as germanium, silicon germanium, III-V compound semiconductors, or the like, may be used to form P− epitaxy layer 22.

Isolation regions 24 are formed adjacent to the top surface of P− epitaxy layer 22. Isolation regions 24 may be Shallow Trench Isolation (STI) regions, and hence are referred to as STI regions 24 hereinafter, although they may also be other types of isolation regions such as field oxides form through the local oxidation of P− epitaxy layer 22. STI regions 24 may be used to separate different device regions, which include vertical power MOSFET region 100, high-side MOSFET region 200, low-voltage NMOSFET region 300, and low-voltage PMOSFET region 400.

Figure 2:
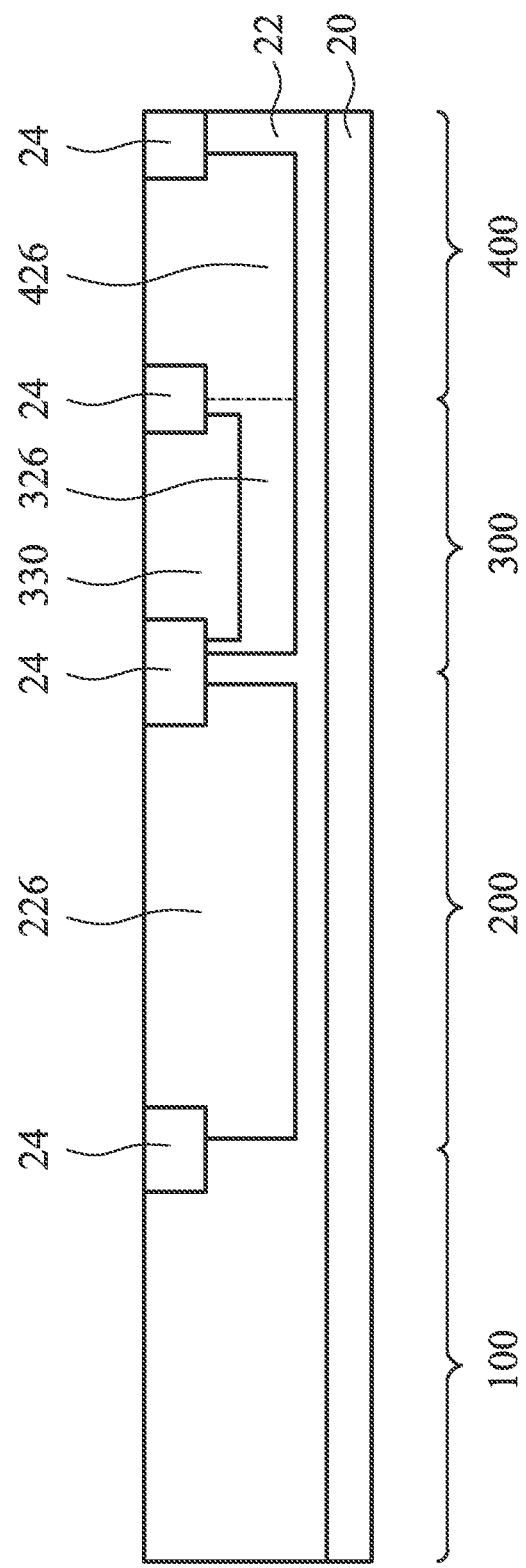

Referring to FIG. 2, High-Voltage N-Well (HVNW) regions 226 is formed in high-side MOSFET region 200, for example, by implanting an n-type impurity into epitaxy layer 22. HVNW regions 326 and 426 are also formed in low-voltage NMOSFET region 300 and low-voltage PMOSFET region 400, respectively. HVNW regions 226, 326, and 426 extend from the top surface of P− epitaxy layer 22 down into P− epitaxy layer 22. The bottom surfaces of HVNW regions 226, 326, and 426 are higher than the top surface of heavily doped semiconductor layer 20. Accordingly, HVNW regions 226, 326, and 426 are spaced apart from heavily doped semiconductor layer 20 by a portion of P− epitaxy layer 22. HVNW regions 226, 326, and 426 may have an impurity concentration between about $10^{14}/cm^3$ and about $10^{17}/cm^3$, for example.

Again referring to FIG. 2, p-well region 330 is formed in low-voltage NMOSFET region 300, for example, through an implantation. P-well region 330 extends from the top surface of HVNW region 326 into HVNW region 326. The bottom surface of p-Well region 330 may be higher than the bottom surface of HVNW region 326. Accordingly, p-well region 330 is spaced apart from P− epitaxy layer 22 by a portion of HVNW region 326. P-well region 330 may have an impurity concentration between about $10^{15}/cm^3$ and about $10^{18}/cm^3$.

Figure 3:
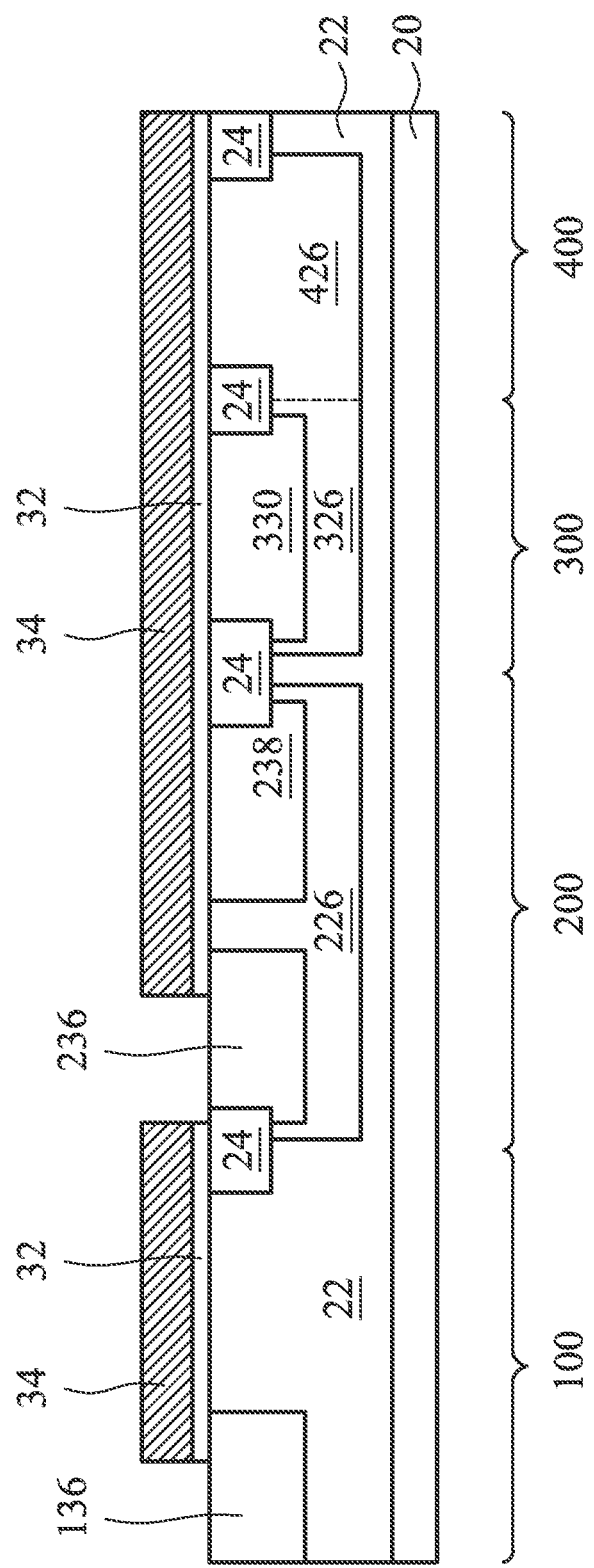

Next, as shown in FIG. 3, gate oxide layer 32 is formed. In some embodiments, the formation process includes a thermal oxidation process. Accordingly, gate oxide layer 32 may comprise silicon oxide. In alternative embodiments, gate oxide layer 32 is formed through deposition. The corresponding gate oxide layer 32 may include silicon oxide, silicon nitride, silicon oxynitride, silicon carbide, combinations thereof, or multi-layers thereof. Gate electrode layer 34 is formed over gate oxide layer 32. The formation process may include a blanket deposition of a conductive material. In some embodiments, gate electrode layer 34 comprises polysilicon, although other conductive materials such as metals, metal silicides, or the like, may also be used.

As also illustrated in FIG. 3, some portions of gate electrode layer 34 in vertical power MOSFET region 100 and high-side MOSFET region 200 are removed in a patterning step. An implantation is then performed to form p-body regions 136 and 236 by implanting a p-type impurity in to P– epitaxy layer 22. The p-type impurity concentration of p-body regions 136 and 236 may be between about $10^{16}/cm^3$ and about $10^{19}/cm^3$. In some exemplary embodiments, the implantation of p-body regions 136 and 236 is performed after the patterning of gate electrode layer 34 and before the removal of the portions of gate oxide layer 32 that are underlying the removed portions of gate electrode 34. After the implantation, the portions of gate oxide layer 32 that are underlying the removed portions of gate electrode 34 are also removed.

Figure 4:
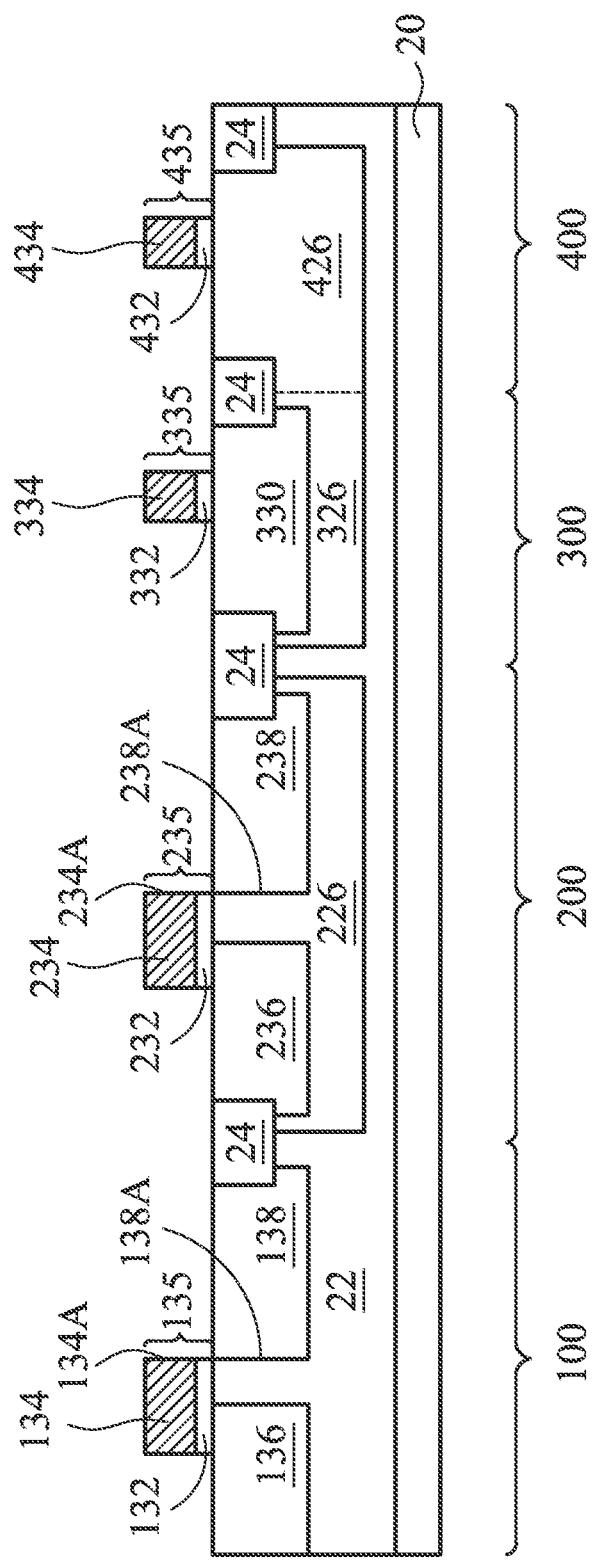

Next, referring to FIG. 4, gate oxide layer 32 and gate electrode layer 34 are further patterned to form gate stacks 135, 235, 335, and 435 in device regions 100, 200, 300, and 400, respectively. An implantation is then performed to form N-type Doped Drain (NDD) regions 138 and 238, which are in vertical power MOSFET region 100 and high-side MOSFET region 200, respectively. The implanted n-type impurity may include phosphorous and/or arsenic. The n-type impurity concentration of NDD regions 138 and 238 may be between about $10^{16}/cm^3$ and about $10^{19}/cm^3$. The implantation may be substantially vertical, so that edges 138A and 238A are aligned to edges 134A and 234A of the respectively gate electrodes 134 and 234. Accordingly, the formation of NDD regions 138 and 238 are self-aligned to the edges 134A and 234A. As a result, substantially no overlap exists between gate electrode 134 and NDD region 138, and substantially no overlap exists between gate electrode 234 and NDD region 238. This contributes to the reduced gate-to-drain capacitance of the resulting MOSFETs in device regions 100 and 200.

Figure 5:
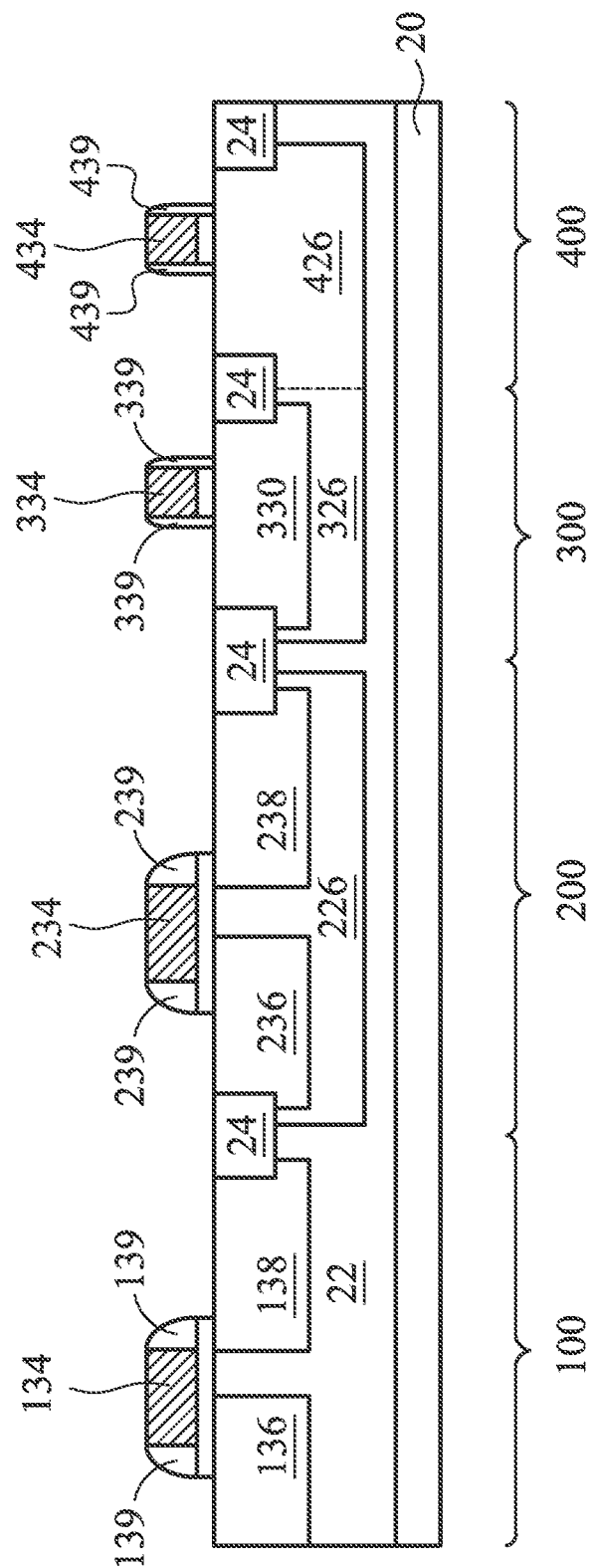

In FIG. 5, gate spacers 139, 239, 339, and 439 are formed, for example, by depositing a dielectric layer, and etching the dielectric layer to remove the horizontal portions. The remaining vertical portions of the dielectric layer form gate spacers 139, 239, 339, and 439.

Figure 6:
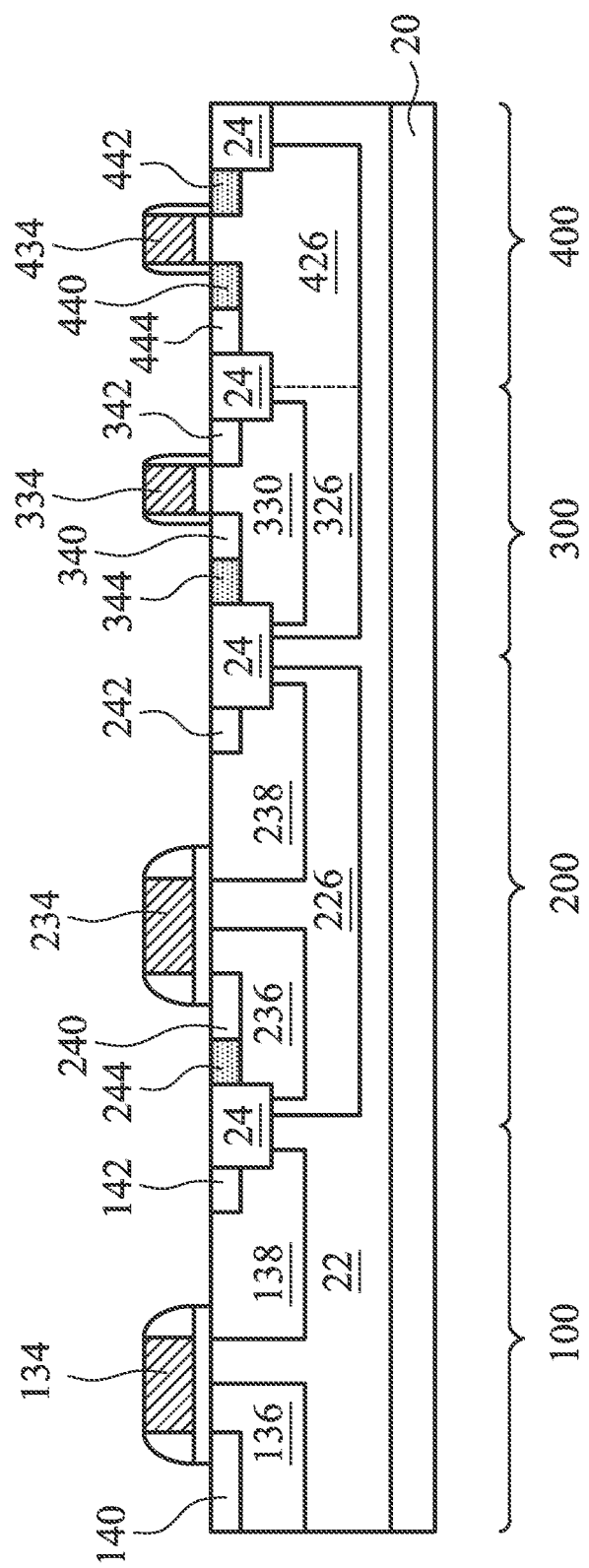

Referring to FIG. 6, an n-type implantation step is performed to form heavily doped n-type source/drain regions 140, 142, 240, 242, 340, and 342 and n-type pickup region 444. The implanted regions may have an n-type impurity concentration between about $10^{19}/cm^3$ and about $10^{21}/cm^3$, for example. Furthermore, a p-type implantation step is performed to form heavily doped p-type source/drain regions 440 and 442 and P+ pickup regions 244 and 344. The implanted regions may have a p-type impurity concentration between about $10^{19}/cm^3$ and about $10^{21}/cm^3$, for example.

Figure 7:
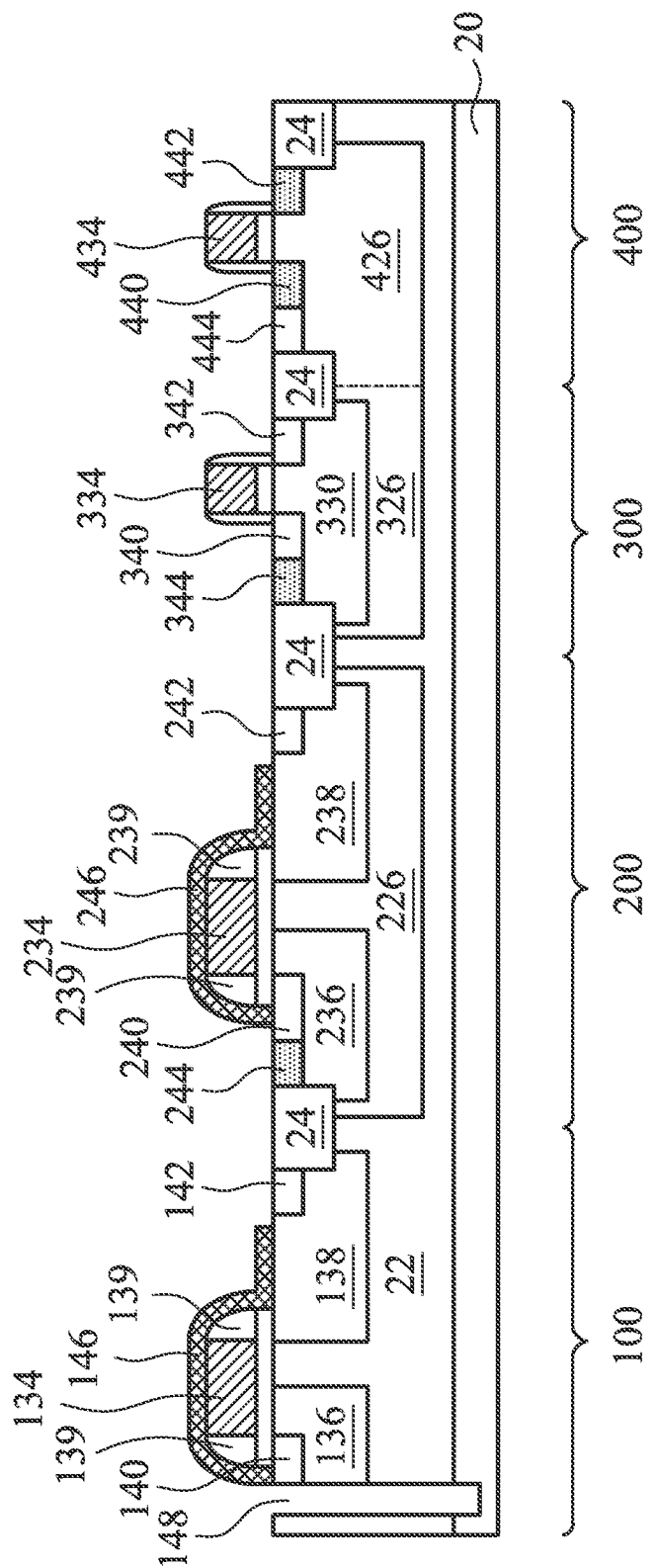

Referring to FIG. 7, dielectric layers 146 and 246 are formed. Dielectric layer 146 may comprise portions over gate electrode 134, gate spacers 139, and/or NDD region 138. Dielectric layer 146 may further cover N+ region 140 in some embodiments. Dielectric layer 246 may comprise portions over gate electrode 234, gate spacers 239, and/or NDD region 238. Dielectric layers 146 and 246 may comprise an oxide, a nitride, an oxynitride, combinations thereof, and multi-layers thereof. The formation process may include a blanket deposition step to form a blanket layer, followed by a patterning step to pattern the blanket layer. In alternative embodiments, the patterning of the blanket layer may be performed after the formation of field plates 152 and 252 and deep metal via 150 (not shown in FIG. 7, please refer to FIG. 8).

As also shown in FIG. 7, an etching step is performed to etch N+ source region 140, p-body region 136, and P– epitaxy layer 22. Heavily doped semiconductor layer 20 is exposed to the resulting trench 148. Trench 148 may also extend into the top portion of heavily doped semiconductor region 20. The bottom portion of heavily doped semiconductor region 20 is not etched. The sidewalls of N+ region 140 and p-body region 136 may be exposed to trench 148 in some embodiments.

Figure 8:
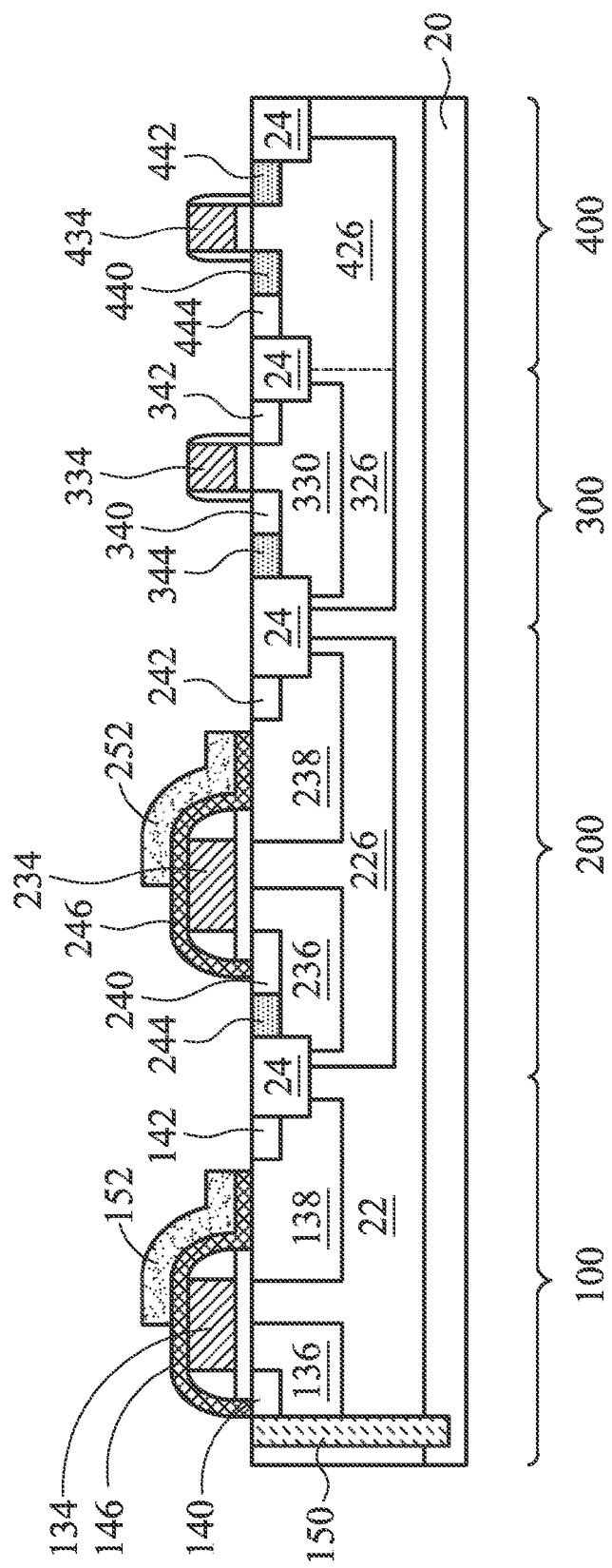

In FIG. 8, a conductive material is filled into trench 148 and over dielectric layers 146 and 246. The formation process may include a blanket deposition step, and a patterning/etching-back step to remove excess portions of the conductive material. The portions of the conductive material over dielectric layers 146 and 246 form field plates 152 and 252, respectively. Field plate 152 may, or may not, include a first portion overlapping a portion of gate electrode 134, and may include a second portion level with and on the drain side of gate electrode 134. The second portion of field plate 152 overlaps NDD region 138. Similarly, field plate 252 may, or may not, include a first portion overlapping a portion of gate electrode 234, and may further include a second portion level with and on the drain side of gate electrode 234. The conductive material for forming field plates 152 and 252 may comprise a metal such as tungsten, aluminum, nickel, or the like, although other conductive materials such as polysilicon, metal silicides, and the like, may also be used. The portion of the conductive material forms deep via 150, which is electrically coupled to, and contacts, N+ region 140 and p-body region 136. Deep via 150 is also electrically shorted to heavily doped semiconductor layer 20.

Figure 9:
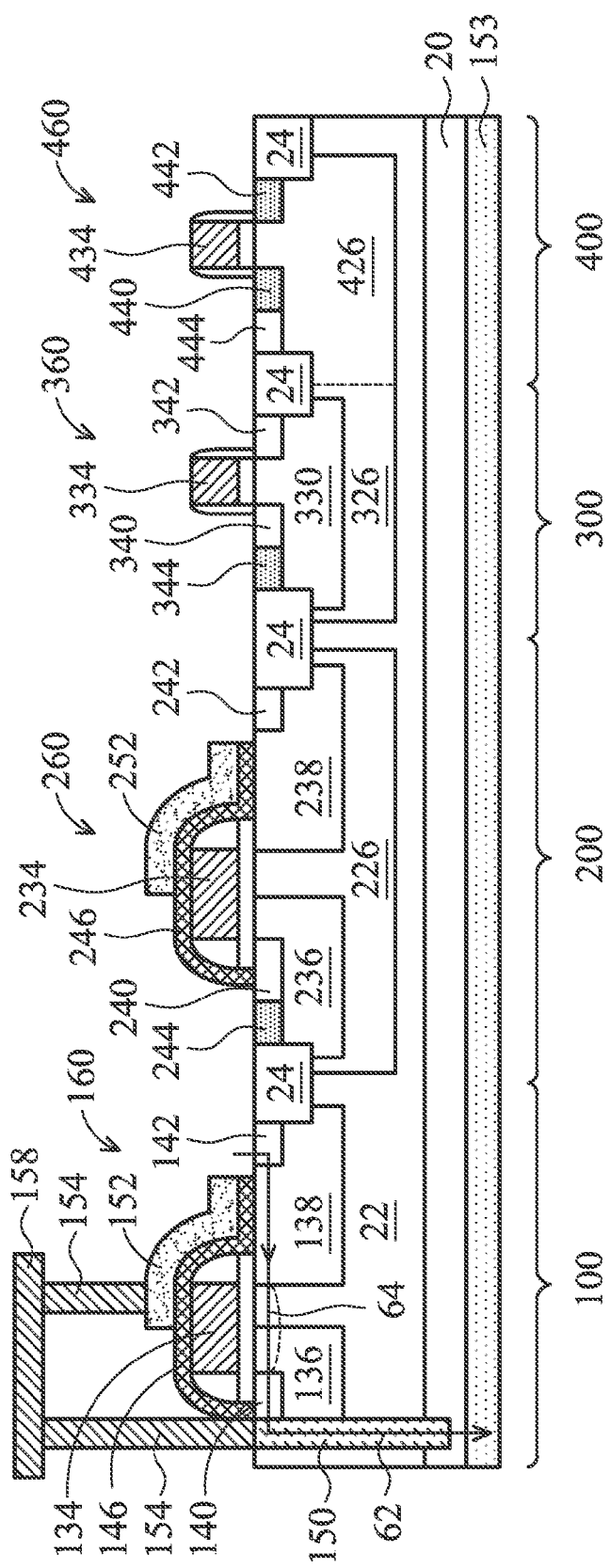

Referring to FIG. 9, an electrical connection is formed to electrically short deep metal via 150 to field plate 152. The electrical connection may include contact plugs 154 and metal line 158, for example. Furthermore, a conductive material is deposited on heavily doped semiconductor region 20 to form source electrode 153. Source/drain regions 140/142 and source electrode 153 are thus formed on the opposite sides of the respective wafer and chip. In some embodiments, source electrode 153 comprises a metal such as aluminum, copper, tungsten, nickel, and/or the like. With the formation of deep via 150, field plate 152 is shorted to source electrode 153 (through heavily doped semiconductor layer 20). Also, the source region 140 is connected to the source electrode 153 through deep via 150. Vertical power MOSFET 160 is thus formed. The formation of high-side MOSFET 260, low-voltage NMOSFET 360, and low-voltage PMOSFET 460 is also finished.

An on-current of vertical power MOSFET 100 is schematically illustrated using curved arrow 62, which passes through drain region 142, NDD region 138, channel region 64 in P– epitaxy layer 22 and p-type body 136, source region 140, deep via 150, heavily doped semiconductor layer 20, and reaches source electrode 153.

Although the embodiments shown in FIGS. 1 through 9 provide methods of forming n-type vertical power MOSFETs, one skilled in the art will realize that the provided teaching is readily available for the formation of p-type vertical power MOSFETs, with the conductivity types of the respective doped semiconductor regions inverted.

In the embodiments, NDD region 138 is self-aligned to the edge of gate electrode 134. Therefore, the overlap between gate electrode 134 and NDD region 138 is minimized, and hence the gate-to-drain capacitance is minimized. Field plate 152 is shorted to semiconductor source region 140 and source electrode 153, and hence field plate 152 does not contribute to the gate-to-drain capacitance. Source electrode 153 and source/drain regions 140/142 are on opposite sides of the respective chip, and source electrode 153 is underlying source/drain regions 140/142. Since channel 64 is horizontal, the breakdown voltage of the respective MOSFET 160 is determined by the lateral sizes, such as the width of NDD region 138 and the width of p-body region 136, and the width of the portion of P– epitaxy layer 22 between p-body region 136 and NDD region 138. Deep via 150, which may be a metal via, is connected to the heavily doped semiconductor layer 20. Deep via 150 forms the deep body pickup region for reducing the bulk resistance of vertical power MOSFET 160.

In accordance with embodiments, a device includes a semiconductor region in a semiconductor chip, a gate dielectric layer over the semiconductor region, and a gate electrode over the gate dielectric. A drain region is disposed at a top surface of the semiconductor region and adjacent to the gate electrode. A gate spacer is on a sidewall of the gate electrode. A dielectric layer is disposed over the gate electrode and the gate spacer. A conductive field plate is over the dielectric layer, wherein the conductive field plate has a portion on a drain side of the gate electrode. A deep metal via is disposed in the semiconductor region. A source electrode is underlying the semiconductor region, wherein the source electrode is electrically shorted to the conductive field plate through the deep metal via.

In accordance with other embodiments, a device includes a metal source electrode, a heavily doped semiconductor layer of a first conductivity type over the metal source electrode, and a lightly doped semiconductor layer of the first conductivity type over the heavily doped semiconductor layer. A gate dielectric is over the lightly doped semiconductor layer. A gate electrode is over the gate dielectric. A drain region and a source region are on opposite sides of the gate electrode, wherein the drain region and the source region are of a second conductivity type opposite the first conductivity type. A deep metal via extends from a top surface of the source region down to contact the heavily doped semiconductor layer, wherein the deep metal via is electrically shorted to the source region.

In accordance with yet other embodiments, a method includes performing an epitaxy to form a lightly doped semiconductor layer of a first conductivity type over a heavily doped semiconductor substrate of the first conductivity type, forming a gate dielectric over the lightly doped semiconductor layer, and forming a gate electrode over the gate dielectric. A drain region and a source region are formed on opposite side of the gate electrode, wherein the drain region and the source region are of a second conductivity type opposite the first conductivity type. A trench is formed to extend from a top surface of the source region downwardly to contact the heavily doped semiconductor substrate. The trench is filled with a metallic material to form a deep metal via. A source electrode is deposited underlying the heavily doped semiconductor substrate, wherein the deep metal via is shorted to the source region and the source electrode.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

The invention claimed is:

1. A method comprising:
performing an epitaxy to form a lightly doped semiconductor layer of a first conductivity type over a heavily doped semiconductor substrate of the first conductivity type;
forming a gate dielectric over the lightly doped semiconductor layer;
forming a gate electrode over the gate dielectric;
forming a gate spacer on a sidewall of the gate electrode;
forming a drain region and a source region on opposite sides of the gate electrode, wherein the drain region and the source region are of a second conductivity type opposite to the first conductivity type;
forming a dielectric layer over and contacting the gate electrode, the source region, and the drain region;
forming a trench extending from a top surface of the source region downwardly to contact the heavily doped semiconductor substrate, wherein a first edge of a vertical portion of the dielectric layer is aligned to an edge of the trench, and the vertical portion further comprises a second edge opposite to the first edge, with the second edge contacting an edge of the gate dielectric and an edge of the gate spacer;
filling the trench with a metallic material to form a conductive via;
forming a conductive material as a blanket layer, wherein the blanket layer comprises:
a first portion overlapping the gate electrode; and
a second portion filling the trench;
etching a portion of the blanket layer to physically separate the first portion and the second portion from each other, with the first portion and the second portion being a conductive field plate and a conductive via, respectively; and
forming a source electrode underlying the heavily doped semiconductor substrate, wherein the conductive via is electrically shorted to the source region and the source electrode.

2. The method of claim 1, further comprising: and
forming an electrical connection to electrically connect the conductive field plate to the conductive via, wherein the electrical connection comprises a conductive feature directly over both the gate electrode and the conductive field plate.

3. The method of claim 1, wherein the conductive field plate further comprises:
a portion on a drain side of the gate electrode, with the portion of the conductive field plate leveled with the gate electrode.

4. The method of claim 1, wherein the conductive field plate comprises
a first portion on a drain side of the gate electrode, with the first portion extending farther away from the gate electrode than a gate spacer, with the gate spacer on a sidewall of the gate electrode; and
a second portion extending further away from the lightly doped semiconductor layer than the gate electrode.

5. The method of claim 1, wherein the gate spacer and the dielectric layer are formed in separate process steps using different materials.

6. The method of claim 1, wherein the gate electrode is formed in two patterning processes, and the method further comprises:
forming a body region between the two patterning processes.

7. The method of claim 1 further comprising:
when the gate dielectric and the gate electrode are formed, simultaneously forming a gate dielectric and a gate electrode for a MOS device, with the MOS device comprising a p-body, and an n-well region separating the p-body from the lightly doped semiconductor layer; and
when the source region and drain region is formed, simultaneously forming a source region and a drain region for the MOS device.

8. A method comprising:
depositing a gate dielectric layer and a gate electrode layer over a semiconductor layer;
performing a first patterning on the gate dielectric layer and the gate electrode layer to form a patterned gate dielectric layer and a patterned gate electrode layer, respectively;
performing a second patterning on the patterned gate dielectric layer and the patterned gate electrode layer to form a gate dielectric and a gate electrode, respectively;
forming a gate spacer contacting a sidewall of the gate electrode;
forming a drain region and a source region on opposite sides of the gate electrode;
depositing a dielectric layer over the gate electrode, the source region, and the drain region, wherein the dielectric layer comprises a vertical portion having a first edge and a second edge opposite to the first edge, and the second edge contacts an edge of the gate dielectric and an edge of the gate spacer;
forming a source electrode, wherein the source electrode and the gate electrode are on opposite sides of the semiconductor layer;
forming a conductive via penetrating through the semiconductor layer, wherein the conductive via electrically connects the source region to the source electrode;
forming a conductive field plate adjacent to and electrically insulated from the gate electrode, the source region, and the drain region; and
forming a contact plug to electrically connect the conductive field plate to the conductive via, wherein the contact plug has a bottom surface contacting a top surface of the conductive field plate, and the contact plug overlaps the gate electrode, wherein the first edge of the vertical portion of the dielectric layer is aligned to an edge of the conductive via.

9. The method of claim 8 further comprising, after the first patterning and before the second patterning, implanting a portion of the semiconductor layer to form a body region.

10. The method of claim 8, wherein the forming the conductive field plate comprises:
forming a first portion overlapping the gate electrode; and
forming a second portion leveled with the gate electrode, with the second portion being on a drain side of the gate electrode.

11. The method of claim 8, wherein the forming the conductive field plate comprises:
forming a first portion on a drain side of the gate electrode, with the first portion extending farther away from the gate electrode than a gate spacer on a sidewall of the gate electrode; and
forming a second portion extending further away from the semiconductor layer than the gate electrode.

12. The method of claim 8 further comprising:
after the forming the source region, forming a dielectric layer comprising:
a first portion overlapping the gate electrode, with the conductive field plate comprising an additional portion over and in contact with the first portion of the dielectric layer; and
second portions level with and on opposite sides of the gate electrode, wherein the dielectric layer has an edge vertically aligned to an edge of the conductive via.

13. The method of claim 8 further comprising:
forming a trench penetrating through the semiconductor layer; and
forming the conductive via in the trench, wherein the conductive field plate and the conductive via are formed by steps comprising:
forming a blanket conductive material; and
etching a portion of the blanket conductive material to physically separate the conductive field plate and the conductive via from each other.

14. The method of claim 8 further comprising
forming an additional contact plug in physical contact with the conductive via; and
forming a conductive line interconnecting the contact plug and the additional contact plug.

15. The method of claim 8 further comprising:
when the gate dielectric and the gate electrode are formed, simultaneously forming a gate dielectric and a gate electrode for a low-voltage MOS device; and
when the source region and the drain region are formed, simultaneously forming a source region and a drain region for the low-voltage MOS device.

16. The method of claim 8 further comprising:
when the gate dielectric and the gate electrode are formed, simultaneously forming a gate dielectric and a gate electrode for a high-side MOS device; and
when the source region and the drain region are formed, simultaneously forming a source region and a drain region for the high-side MOS device.

17. A method comprising:
forming a lightly doped semiconductor layer over a heavily doped semiconductor substrate, wherein the lightly doped semiconductor layer and the heavily doped semiconductor substrate are of a first conductivity type;

depositing a gate dielectric layer and a gate electrode layer over the lightly doped semiconductor layer;

performing a first patterning on the gate dielectric layer and the gate electrode layer to form a patterned gate dielectric layer and a patterned gate electrode layer, respectively;

using the patterned gate dielectric layer and the patterned gate electrode layer as an implantation mask to form a body region in the lightly doped semiconductor layer;

performing a second patterning on the patterned gate dielectric layer and the patterned gate electrode layer to form a gate dielectric and a gate electrode, respectively;

forming gate spacers on opposite sidewalls of the gate electrode;

forming a drain region and a source region on opposite sides of the gate electrode, wherein the drain region and the source region are of a second conductivity type opposite to the first conductivity type;

forming a dielectric layer comprising:
 a first portion overlapping the gate electrode; and
 second portions leveled with and on opposite sides of the gate spacers;

etching the source region to form a trench penetrating through the lightly doped semiconductor layer, wherein an edge of the trench is aligned to an edge of the dielectric layer;

filling the trench with a metallic material to form a conductive via; and forming a conductive field plate comprising a portion over the gate electrode, wherein when the forming the conductive field plate is finished, an entirety of the trench is filled by the conductive via, and the conductive field plate and the conductive via are formed by steps comprising:
 forming a blanket conductive material; and
 etching a portion of the blanket conductive material to physically separate the conductive field plate and the conductive via from each other.

18. The method of claim 17, wherein the dielectric layer comprises a vertical portion having a first edge and a second edge opposite to the first edge, and the second edge contacts an edge of the gate dielectric and an edge of one of the gate spacers, and the first edge of the vertical portion of the dielectric layer is aligned to an edge of the conductive via.

19. The method of claim 17 further comprising depositing a source electrode, wherein the source electrode and the source region are interconnected through the conductive via.

* * * * *